(12) United States Patent
Brunnbauer et al.

(10) Patent No.: US 8,080,880 B2
(45) Date of Patent: Dec. 20, 2011

(54) SEMICONDUCTOR DEVICE WITH ARRANGEMENT OF PARALLEL CONDUCTOR LINES BEING INSULATED, BETWEEN AND ORTHOGONAL TO EXTERNAL CONTACT PADS

(75) Inventors: Markus Brunnbauer, Lappersdorf (DE); Jens Pohl, Bernhardswald (DE); Thorsten Meyer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 314 days.

(21) Appl. No.: 12/408,110

(22) Filed: Mar. 20, 2009

(65) Prior Publication Data

US 2010/0237506 A1 Sep. 23, 2010

(51) Int. Cl.
*H01L 29/40* (2006.01)

(52) U.S. Cl. ........ 257/773; 257/459; 257/503; 257/659; 257/664; 257/672; 438/618

(58) Field of Classification Search .................. 257/459, 257/503, 659, 664, 672, 773; 438/618
See application file for complete search history.

(56) References Cited

U.S. PATENT DOCUMENTS

7,307,340 B2 * 12/2007 Baek et al. .................. 257/723
* cited by examiner

*Primary Examiner* — Thanh V Pham
(74) *Attorney, Agent, or Firm* — Dicke, Billig & Czaja, PLLC (57) ABSTRACT

A semiconductor device and manufacturing method. One embodiment provides a device including a semiconductor chip. A first conductor line is placed over the semiconductor chip. An external contact pad is placed over the first conductor line. At least a portion of the first conductor line lies within a projection of the external contact pad on the semiconductor chip.

13 Claims, 11 Drawing Sheets

SEMICONDUCTOR DEVICE WITH ARRANGEMENT OF PARALLEL CONDUCTOR LINES BEING INSULATED, BETWEEN AND ORTHOGONAL TO EXTERNAL CONTACT PADS

BACKGROUND

This invention relates to a device including a semiconductor chip, at least one conductor line and at least one external contact element. Furthermore, the invention relates to a method of manufacturing such a device.

Wafer level packaging is gaining interest throughout the semiconductor industry. Conductor lines are used to provide redistribution layers in the wafer level packages. So far the routing density in the wafer level packages is limited by technologies reasons, but the designers are steadily pushing towards tighter and tighter design rules.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this Specification, the terms "coupled" and/or "electrically coupled" are not meant to mean that the elements must be directly coupled together; intervening elements may be provided between the "coupled" or "electrically coupled" elements.

Devices containing semiconductor chips are described below. The semiconductor chips may be of different types, may be manufactured by different technologies and may include for example integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as MEMS (micro-electro mechanical systems) and may include micro-mechanical structures, such as bridges, membranes or tongue structures. The semiconductor chips may be configured as sensors or actuators, for example pressure sensors, acceleration sensors, rotation sensors, microphones etc. The semiconductor chips may be configured as antennas and/or discrete passives and/or chip stacks. Semiconductor chips in which such functional elements are embedded generally contain electronic circuits which serve for driving the functional elements or further process signals generated by the functional elements. The semiconductor chips need not be manufactured from specific semiconductor material, for example Si, SiC, SiGe, GaAs, and, furthermore, may contain inorganic and/or organic materials that are not semiconductors, such as for example discrete passives, antennas, insulators, plastics or metals.

The semiconductor chips may have contact pads (or electrodes) which allow electrical contact to be made with the integrated circuits included in the semiconductor chips. One or more metal layers may be applied to the contact pads of the semiconductor chips. The metal layers may be manufactured with any desired geometric shape and any desired material composition. The metal layers may, for example, be in the form of a layer covering an area. Any desired metal or metal alloy, for example aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The contact pads may be situated on the active main surfaces of the semiconductor chips or on other surfaces of the semiconductor chips.

The devices described below include external contact pads (or external contact elements), which may be of any shape and size. The external contact pads may be accessible from outside the device and may thus allow electrical contact to be made with the semiconductor chips from outside the device. Furthermore, the external contact pads may be thermally conducting and may serve as heat sinks for dissipating the heat generated by the semiconductor chips. The external contact pads may be composed of any desired electrically conductive material, for example of a metal, such as copper, aluminum or gold, a metal alloy or an electrically conductive organic material. Solder material, such as solder balls or solder bumps, may be deposited on the external contact pads.

One or more conductor lines (or conductor tracks) may be placed over the semiconductor chip. The conductor lines may, for example, be used to produce a redistribution layer. The conductor lines may be employed as wiring layers to make electrical contact with the semiconductor chips from outside the device and/or to make electrical contact with other semiconductor chips and/or components contained in the device. The conductor lines may couple the contact pads of the semiconductor chips to the external contact pads. The conductor lines may be manufactured with any desired geometric shape and any desired material composition. Any desired metal, for example aluminum, nickel, palladium, silver, tin, gold or copper, or metal alloys may be used as the material. The conductor lines need not be homogenous or manufactured from just one material, that is to say various compositions and concentrations of the materials contained in the conductor lines are possible. Furthermore, the conductor lines may be arranged above or below or between electrically insulating layers.

At least one of the external contact pads may be arranged such that at least a portion of at least one of the conductor lines lies within a projection of the external contact pad onto the semiconductor chip. In other words, at least one of the external contact pads may overlap at least one of the conductor lines arranged below the external contact pad. Thus, the at least one conductor line may intersect the outline of the external contact pad.

The semiconductor chips or at least parts of the semiconductor chips may be covered with an electrically insulating material. The electrically insulating material may be any appropriate duroplastic, thermoplastic or thermosetting material or laminate (prepreg) and may contain filler materials. Various techniques may be employed to cover the semiconductor chips with the electrically insulating material, for example compression molding, injection molding, powder molding, liquid molding or lamination.

The electrically insulating material may be used to produce fan-out type packages. In a fan-out type package at least some of the external contact pads and/or conductor lines connecting the semiconductor chip to the external contact pads are located laterally outside of the outline of the semiconductor chip or do at least intersect the outline of the semiconductor chip. Thus, in fan-out type packages, a peripherally outer part of the package of the semiconductor chip is typically (additionally) used for electrically bonding the package to external applications, such as application boards etc. This outer part of the package encompassing the semiconductor chip effectively enlarges the contact area of the package in relation to the footprint of the semiconductor chip, thus leading to relaxed constraints in view of package pad size and pitch with regard to later processing, e.g., second level assembly.

Figure 1:
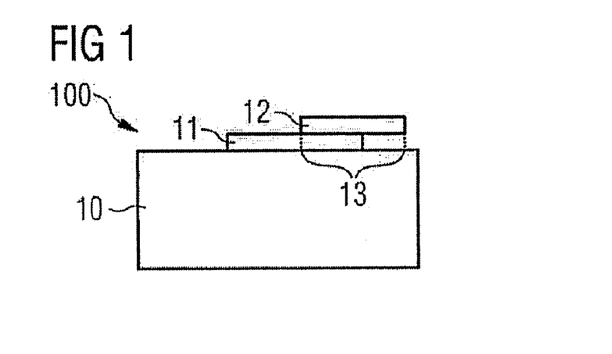
FIG. 1 schematically illustrates a cross-sectional view of one embodiment of a device including a semiconductor chip, a first conductor line and an external contact pad.

FIG. 1 schematically illustrates a device 100 in cross section. The device 100 includes a semiconductor chip 10, a first conductor line 11 placed over the semiconductor chip 10 and an external contact pad 12 placed over the first conductor line 11. The external contact pad 12 is placed over the first conductor line 11 such that at least a portion of the first conductor line 11 lies within a projection of the external contact pad 12 onto the top surface of the semiconductor chip 10. The projection is indicated by dashed lines 13 in FIG. 1.

Figure 2A:
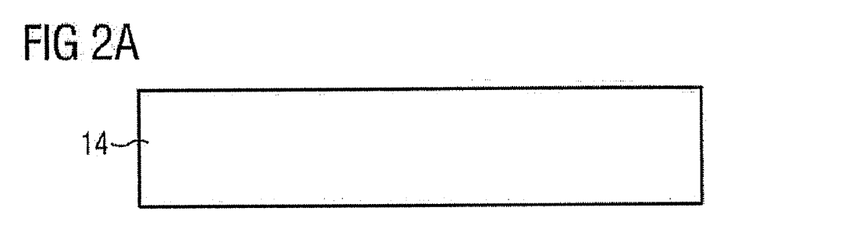
FIGS. 2A to 2D schematically illustrate a cross-sectional view of one embodiment of a method of manufacturing a device including a semiconductor chip, a first conductor line and an external contact pad.
Figure 2B:
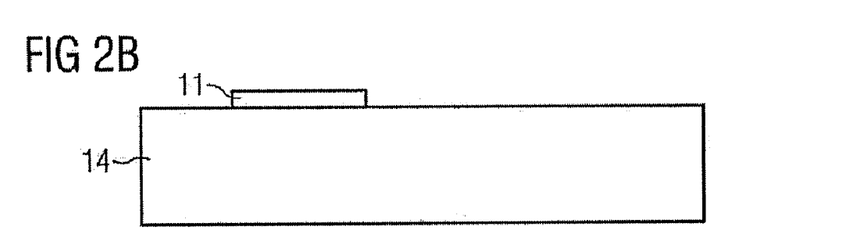
Figure 2C:
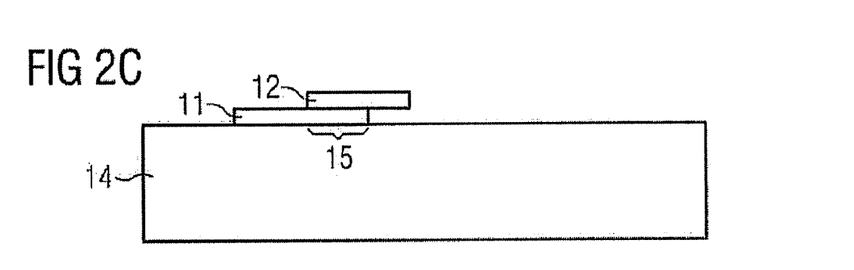
Figure 2D:
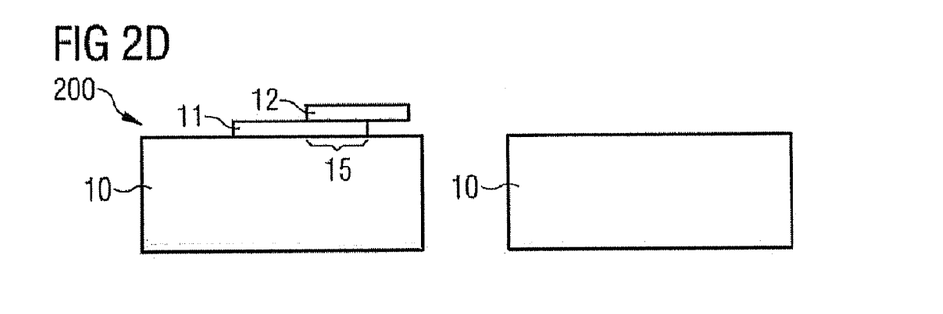

FIGS. 2A to 2D schematically illustrate a method for production of a device 200. A cross section of the device 200 obtained by the method is illustrated in FIG. 2D. Firstly, a semiconductor wafer 14 is provided (see FIG. 2A). A first conductor line 11 is formed over the semiconductor wafer 14 (see FIG. 2B). An external contact pad 12 is formed over the first conductor line 11 such that the external contact pad 12 overlaps at least a portion 15 of the first conductor line 11 (see FIG. 2C). Thereafter the semiconductor wafer 14 is divided into a plurality of semiconductor chips 10 (see FIG. 2D).

Figure 3A:
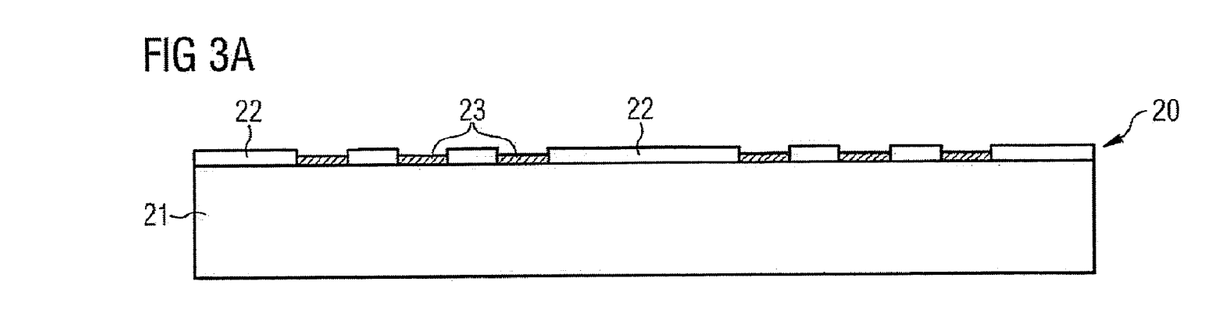
FIGS. 3A to 3M schematically illustrate a cross-sectional view of one embodiment of a method of manufacturing a device including a semiconductor chip, two metallization layers and solder balls deposited on external contact pads.
Figure 3B:
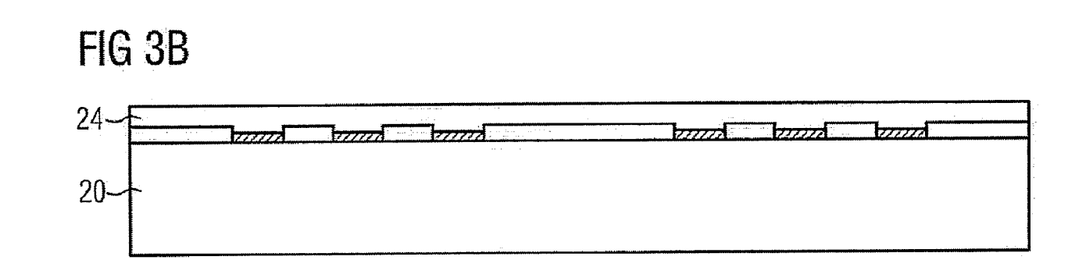
Figure 3C:
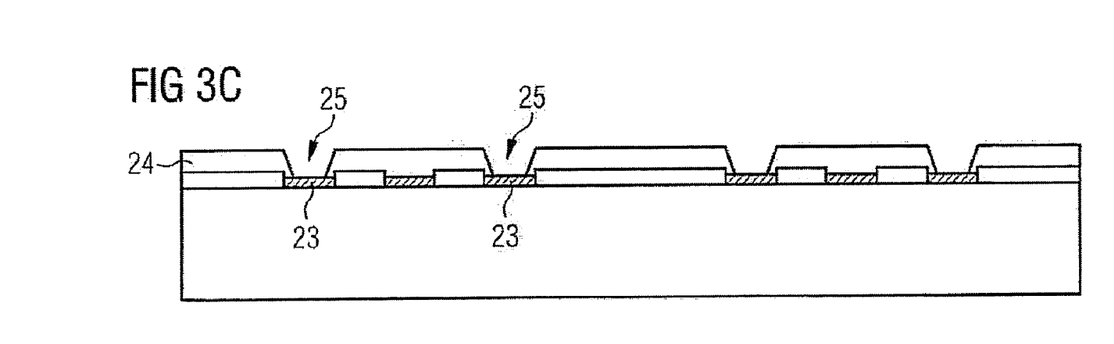
Figure 3D:
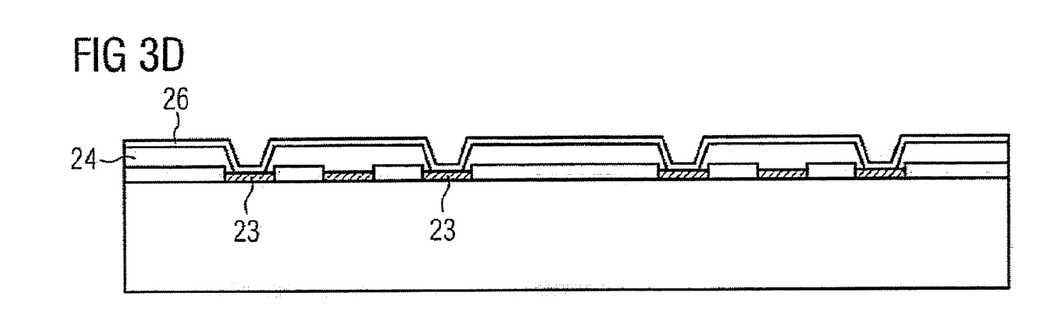
Figure 3E:
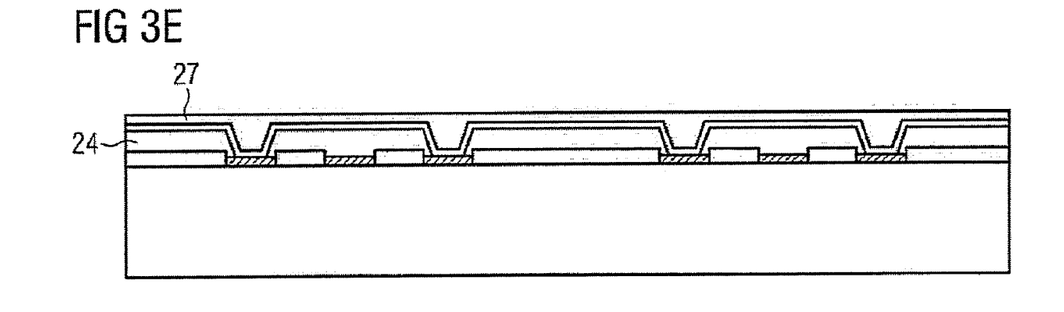
Figure 3F:
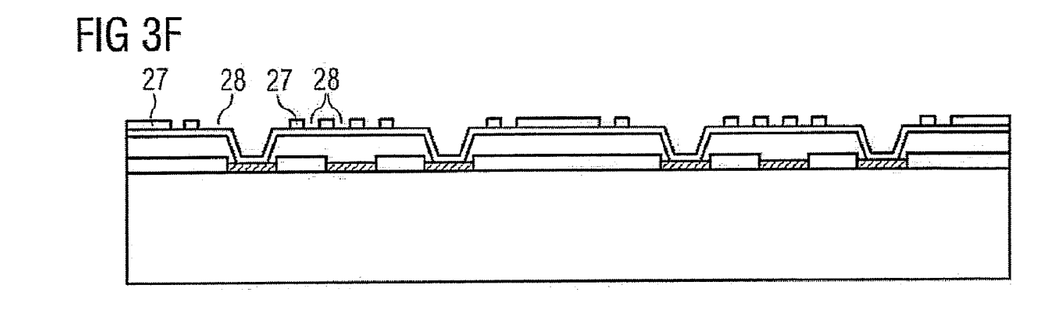
Figure 3G:
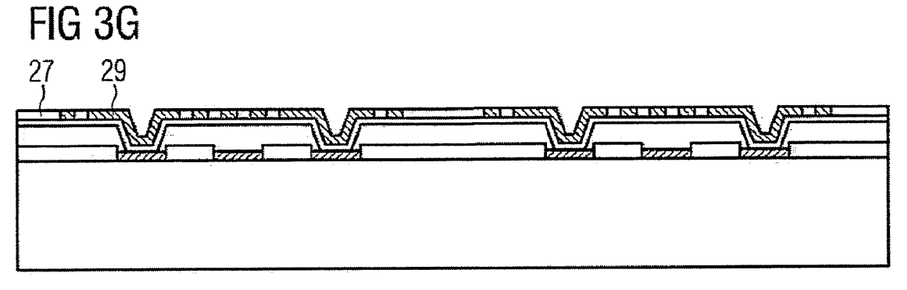
Figure 3H:
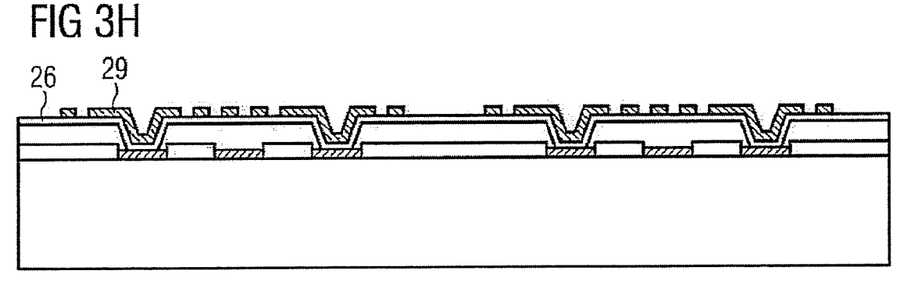
Figure 3I:
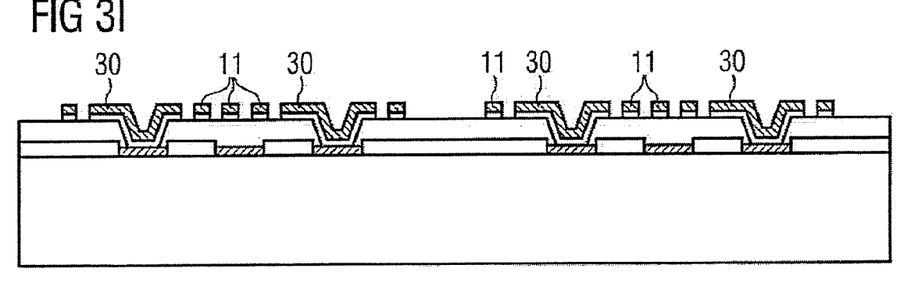
Figure 3J:
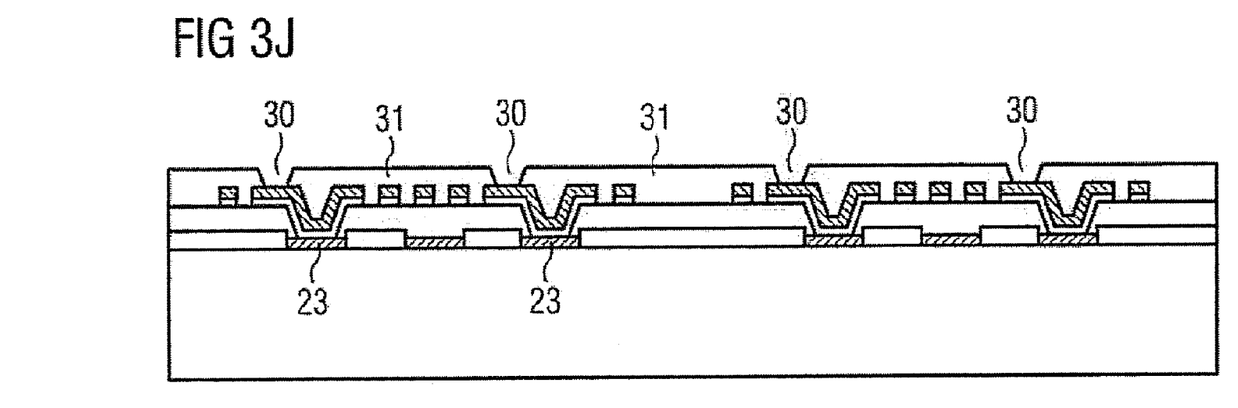
Figure 3K:
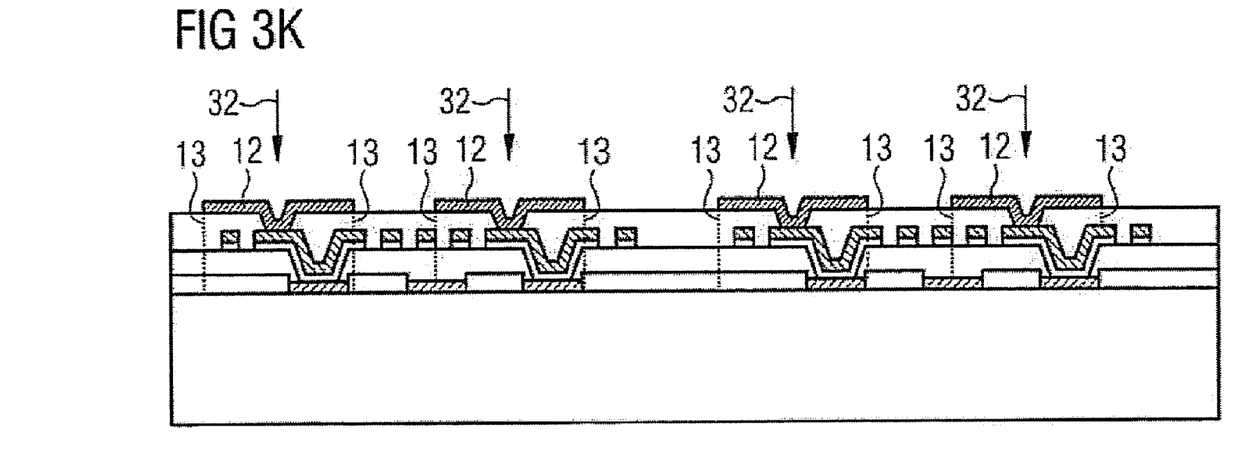
Figure 3L:
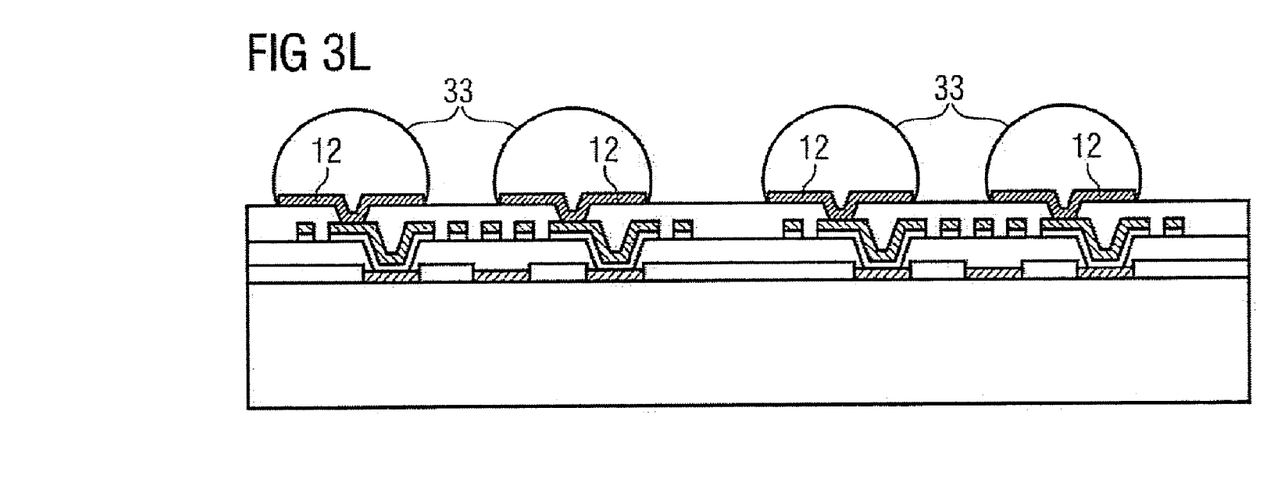
Figure 3M:
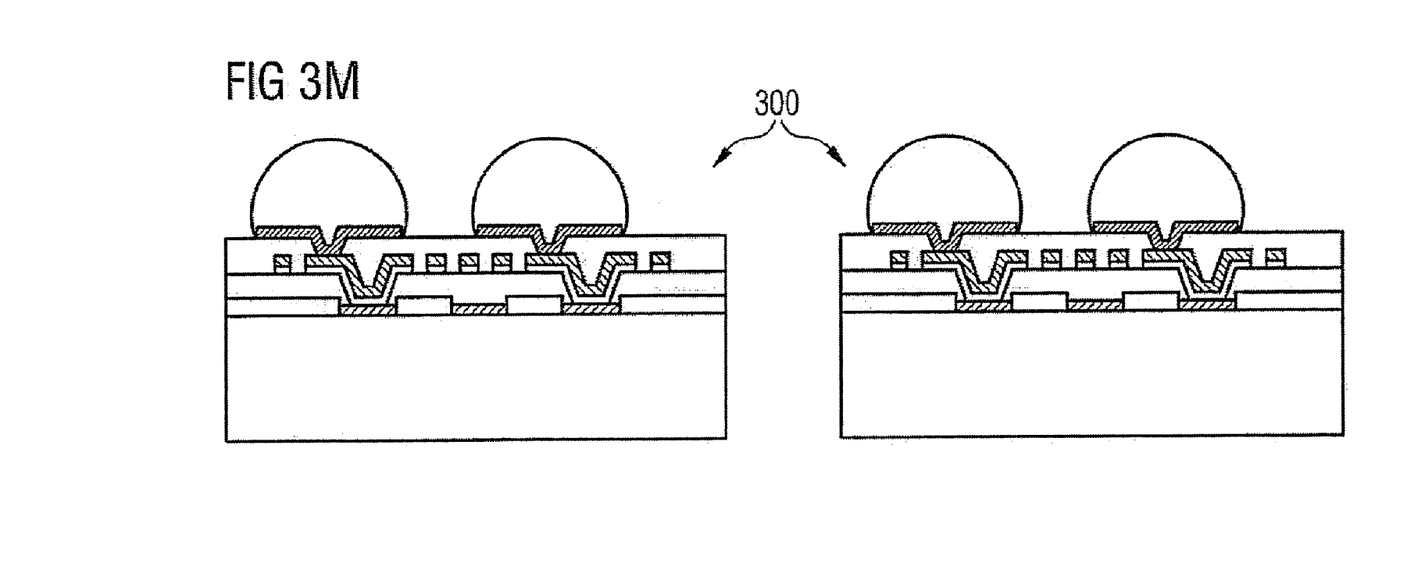

FIGS. 3A to 3M schematically illustrate a method for production of a device 300, a cross section of which is illustrated in FIG. 3M. The device 300 is an implementation of the device 100. The details of the device 300 that are described below can therefore be likewise applied to the device 100. Furthermore, the method illustrated in FIGS. 3A to 3M is an implementation of the method illustrated in FIGS. 2A to 2D. The details of the production method that are described below can therefore be likewise applied to the method of FIGS. 2A to 2D.

The semiconductor chips 10 as well as all other semiconductor chips described herein may be fabricated on a wafer 20 made of semiconductor material. Such a semiconductor wafer 20 is illustrated in FIG. 3A. The semiconductor wafer 20 may include a bulk silicon 21 in which integrated circuits are embedded. A passivation layer 22 is deposited on the upper surface of the bulk silicon 21. The passivation layer 22 may be made of an electrically insulating material, such as silicon nitride or photoresist. Furthermore, contact pads 23 are located on the upper surface of the semiconductor wafer 20. The contact pads 23 are exposed from the passivation layer 22. The integrated circuits can be electrically accessed via the contact pads 23. The contact pads 23 may be made of a metal, for example aluminum or copper, and may have any desired shape and size.

A redistribution layer may be applied to the upper surface of the semiconductor wafer 20. For that purpose, a dielectric layer 24 may be deposited on the upper surface of the semiconductor wafer 20 as illustrated in FIG. 3B. The dielectric layer 24 may be fabricated in various ways. For example, the dielectric layer 24 may be deposited from a gas phase or from a solution, or can be laminated onto the semiconductor wafer 20. Furthermore, thin-film technology methods or a standard PCB industry process flow can be used for the application of the dielectric layer 24. The dielectric layer 24 may be fabricated from a polymer, such as parylene, photoresist material, imide, epoxy, duroplast, silicone, silicon nitride or an inorganic, ceramic-like material, such as silicone-carbon compounds. The thickness of the dielectric layer 24 may be up to 10 μm or even higher.

In order to make electrical contacts to the integrated circuits embedded in the semiconductor wafer 20, the dielectric layer 24 may be opened in areas where contact pads 23 are arranged as illustrated in FIG. 3C. The openings 25 in the dielectric layer 24 may, for example, be produced by using photolithographic methods and/or etching methods.

Afterwards a first metallization layer is applied to the dielectric layer 24 and is structured. According to one embodiment, a seed layer 26, for example a titanium, titanium tungsten or palladium layer, is deposited on the upper surface of the dielectric layer 24 and the exposed contact pads 23 as illustrated in FIG. 3D. The deposition of the seed layer 26 may be carried out by electroless deposition from a solution or by sputtering. The seed layer 26 may have a thickness in the range from 10 to 80 nm, in one embodiment around 50 nm.

The thickness of the seed layer 26 may be increased by depositing a further metal layer onto the seed layer 26. The seed layer 26 can be used as an electrode for a galvanic deposition of the further metal layer, which may, for example, be made of copper and may have a thickness in the range from 100 to 200 nm.

A photoresist layer 27 may be printed or spin-coated on top of the seed layer 26 as illustrated in FIG. 3E. By exposure to light having a suitable wavelength through a mask and subsequent development, recesses 28 are formed in the photoresist layer 27 as illustrated in FIG. 3F.

Subsequently, the portion of the seed layer 26 exposed by the recesses 28 may be reinforced by galvanic deposition of a further metal layer 29 as illustrated in FIG. 3G. During the galvanic deposition of the metal layer 29, the seed layer 26 is employed as an electrode. Copper or other metals or metal alloys may be plated onto the seed layer 26 in the unmasked areas or recesses 28 and to the desired height, which is usually greater than 5 µm.

After the plating of the metal layer 29 the photoresist layer 27 is stripped away by using an appropriate solvent as illustrated in FIG. 3H. The now exposed portions of the original seed layer 26, which have not been covered with the metal layer 29, may be removed by a brief etching process thereby creating separated conductor lines 11 and metal pads 30 as illustrated in FIG. 3I.

A dielectric layer 31 may be deposited on top of the first metallization layer and may be opened in areas where the metal pads 30 are arranged as illustrated in FIG. 3J. The dielectric layer 31 may be produced by using the same or similar materials and processes as described above in connection with the dielectric layer 24.

A second metallization layer is placed over the dielectric layer 31 and the exposed portions of the metal pads 30. The second metallization may be produced by using the same or similar materials and processes as described above in connection with the first metallization layer. The second metallization layer may be structured such that external contact pads 12 remain on the dielectric layer 31 as illustrated in FIG. 3K. Each of the external contact pads 12 is electrically connected to a respective one of the metal pads 30. The diameter of the external contact pads 12 may be greater than the diameter of the metal pads 30. Furthermore, each of the external contact pads 12 is electrically coupled to a respective one of the contacts pads 23 via the conductor lines 11 and/or the metal pads 30. The top surfaces of the external contact pads 12 may not be covered by any electrically insulating material. In one embodiment, the top surfaces of the external contact pads 12 are completely exposed.

The external contact pads 12 are formed such that at least some of the external contact pads 12 overlap sections of one or two or more conductor lines 11, which are arranged below the respective external contact pad 12. In other words, these portions of the conductor lines 11 lie within a projection of the external contact pads 12 onto the top surface of the semiconductor wafer 20. The projection may be orthogonal to the top surface of the semiconductor wafer 20. The direction of the projection is indicated in FIG. 3K by arrows 32, and the outlines of the areas defined by the projections are marked by dashed lines at 13. As can be seen from FIG. 3K each of the external contact pads 12 overlaps portions of one or two conductor lines 11 in the present embodiment.

Solder deposits 33 may be placed onto the external contact pads 12. The solder deposits 33 may be applied to the external contact pads 12 by "ball placement", in which pre-shaped balls composed of solder material are applied to the external contact pads 12. As an alternative to "ball placement", the solder deposits 33 may, for example, be applied by using stencil printing with a solder paste, followed by a heat-treatment process. The solder material may be formed from metal alloys which are composed, for example, from the following materials: SnPb, SnAg, SnAgCu, SnAgCuNi, SnAu, SnCu and SnBi. The solder deposits 33 may be used to electrically couple the devices 300 to other components, for example a PCB.

As illustrated in FIG. 3M, the devices 300 are separated from one another by separation of semiconductor wafer 20 and the redistribution layer, for example by sawing, cutting, etching or a laser beam.

The devices 300 are wafer level packages (WLP). The term "wafer level package" relates to semiconductor chips having an active main surface that has been populated at the wafer level with external contact elements that are required for subsequently making contact with a printed circuit board (PCB). The semiconductor chips (dies) have been singulated only after the application of the redistribution layer and the external contact elements. After singulation, a WLP can be mounted onto a PCB without significant further processing of the main surface. In one embodiment, mounting of the of the WLPs onto an interposer or a leadframe and packaging of the individual WLPs with a mold material or similar material are no longer necessary. WLPs are therefore distinguished by small size, small weight and low production costs.

Since the dimensions of a WLP are either equal in magnitude to those of the semiconductor chip or only insignificantly larger, an expression that is also often used is "chip size package" or "chip scale package." A chip size package has approximately the same size as the semiconductor chip, while a chip scale package is up to 50% larger than the semiconductor chip.

Figure 4:
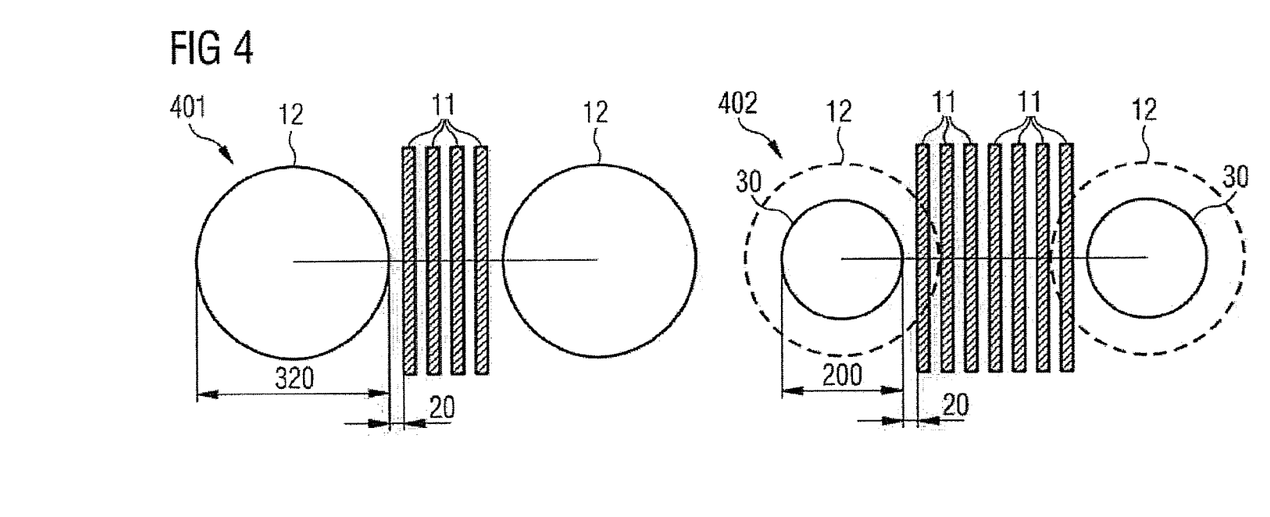
FIG. 4 schematically illustrates a top plan view of two devices manufactured by using different technologies.

FIG. 4 schematically illustrates top views of a device 401 having only one metallization layer (left) and a device 402 having two metallization layers (right) similar to the devices 100, 200 and 300.

In the device 401 the external contact pads 12 are formed in the same metallization layer as the conductor lines 11. If the external contact pads 12 have a diameter of 320 µm and a pitch (center-to-center distance) of 500 µm, and the conductor lines 11 have a width of 20 µm and a line-to-line distance of 20 µm, it is possible to place four conductor lines 11 between two adjacent external contact pads 12.

In the device 402 only the conductor lines 11 and the metal pads 30 are formed by the first metallization layer, while the external contact pads 12 are formed by the second metallization layer on top of the first metallization layer. In FIG. 4 the first metallization layer of the device 402 is illustrated (the second metallization layer is indicated by dashed lines). Since the metal pads 30 have a diameter of 200 µm and a pitch of 500 µm (the external contact pads 12 arranged in the second metallization layer have a diameter of 320 µm and a pitch of 500 µm), it is possible to arrange seven conductor lines 11 between two adjacent metal pads 30. Thus the routing density is increased in the device 402 when compared to the device 401.

Figure 5:
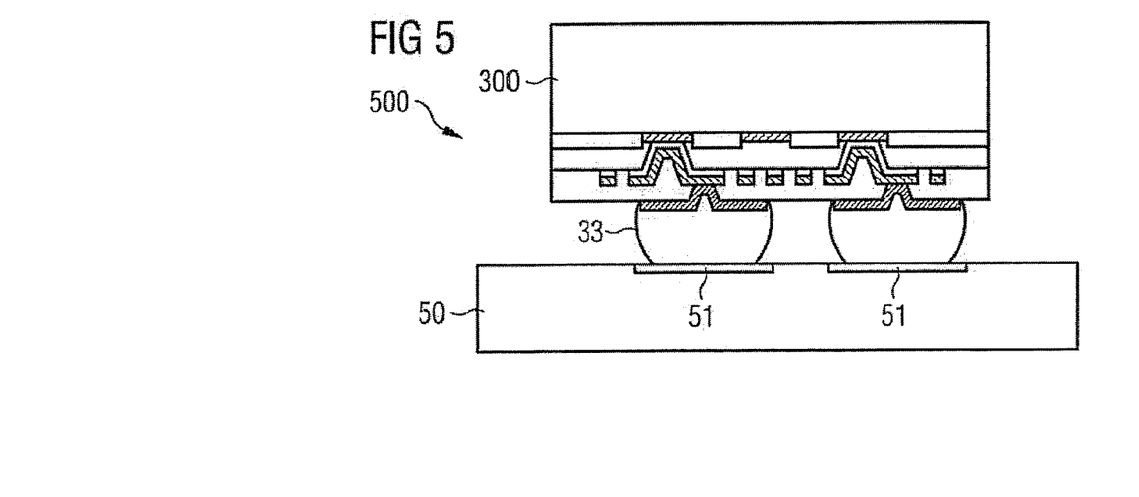
FIG. 5 schematically illustrates a cross-sectional view of one embodiment of a system including a circuit board and a device mounted on the circuit board.

FIG. 5 schematically illustrates a system 500 in cross section. The system 500 includes a circuit board 50, such as a printed circuit board, and the device 300 mounted on the circuit board 50. The solder balls 33 of the device 300 are soldered to contact pads 51 of the circuit board 50. In one embodiment, the device 300 is a wafer level ball grid array package.

Figure 6A:
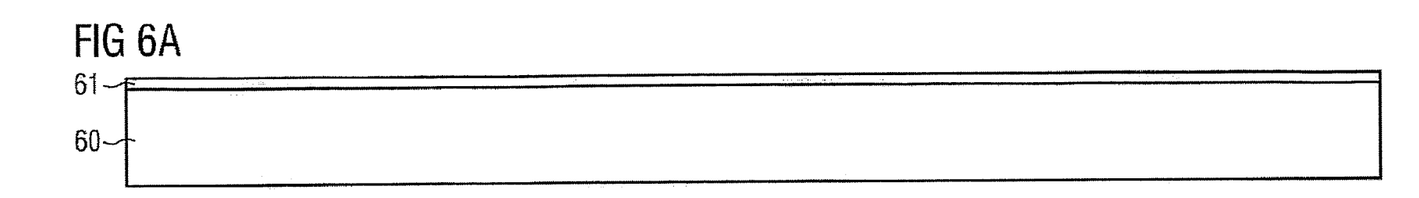
FIGS. 6A to 6J schematically illustrate a cross-sectional view of one embodiment of a method of manufacturing a device including a semiconductor chip, conductor lines, external contact pads and an electrically insulating material embedding the semiconductor chip.
Figure 6B:
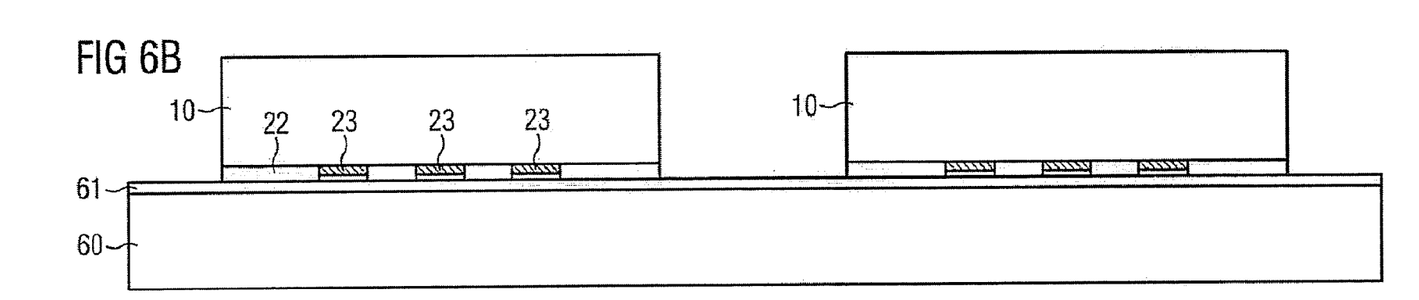
Figure 6C:
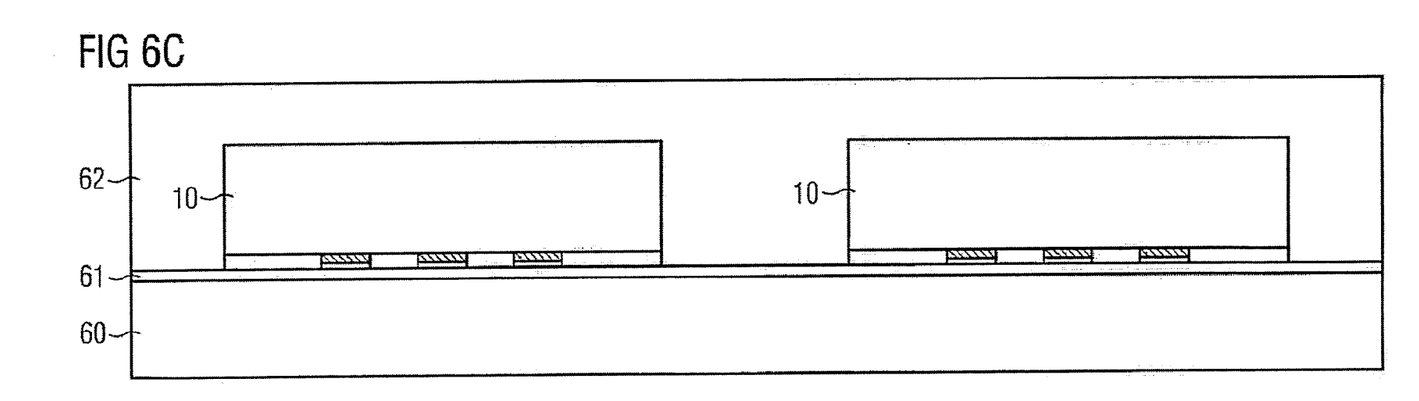
Figure 6D:
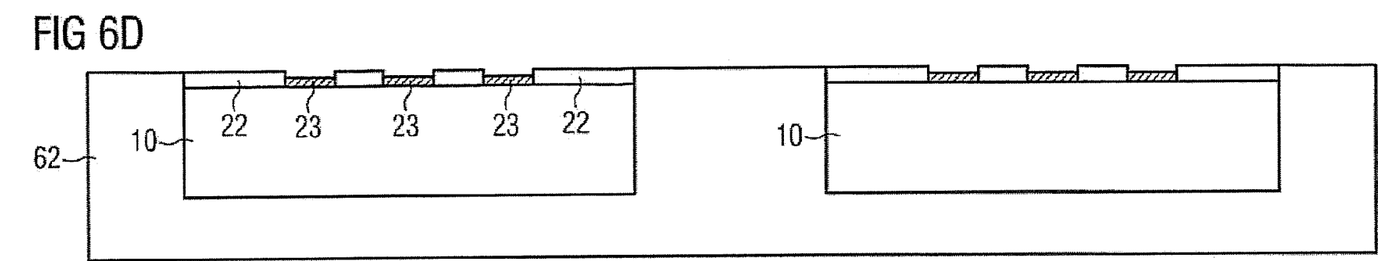
Figure 6E:
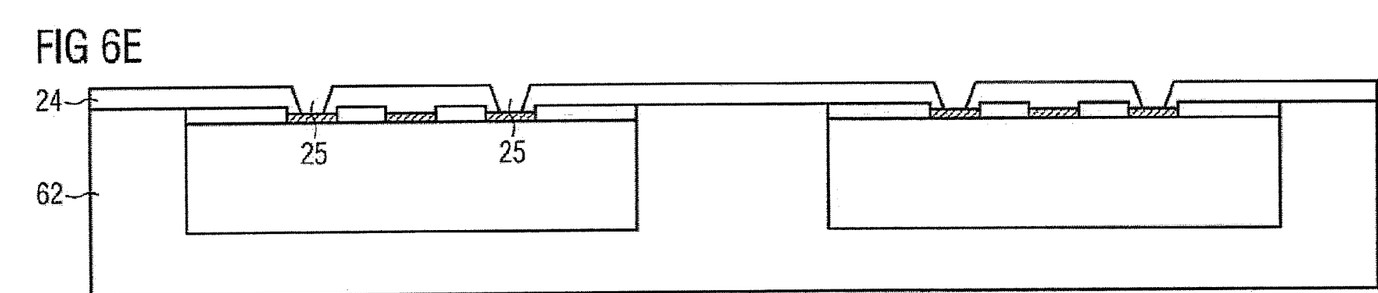
Figure 6F:
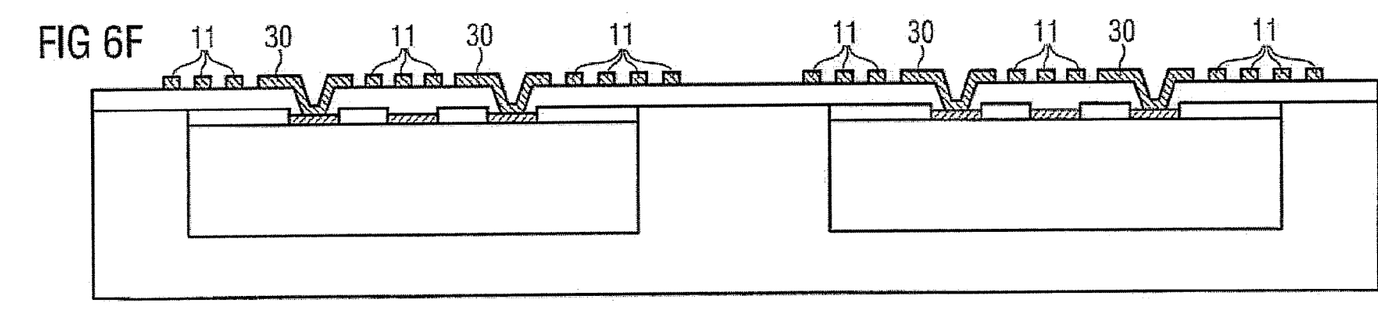
Figure 6G:
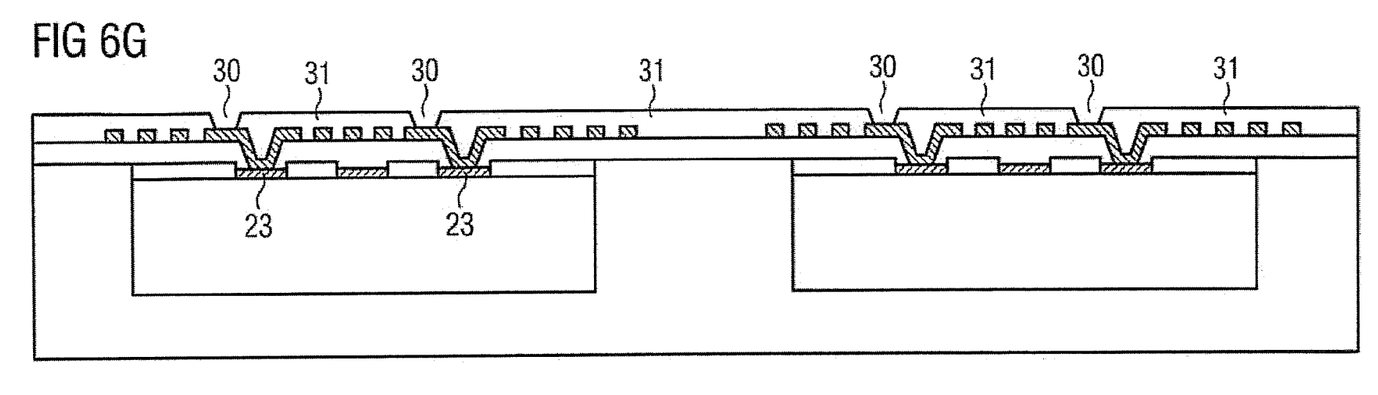
Figure 6H:
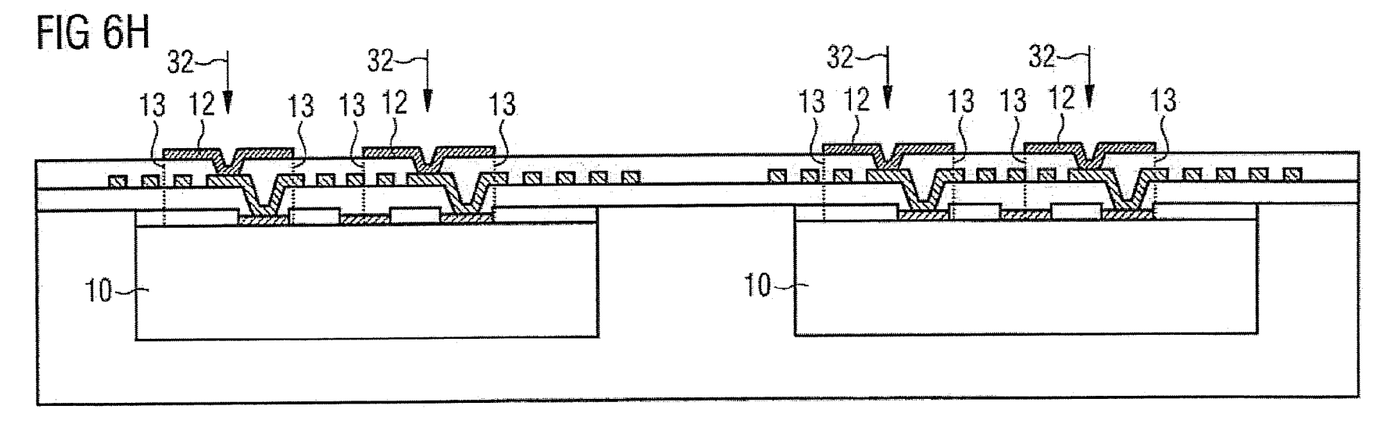
Figure 6I:
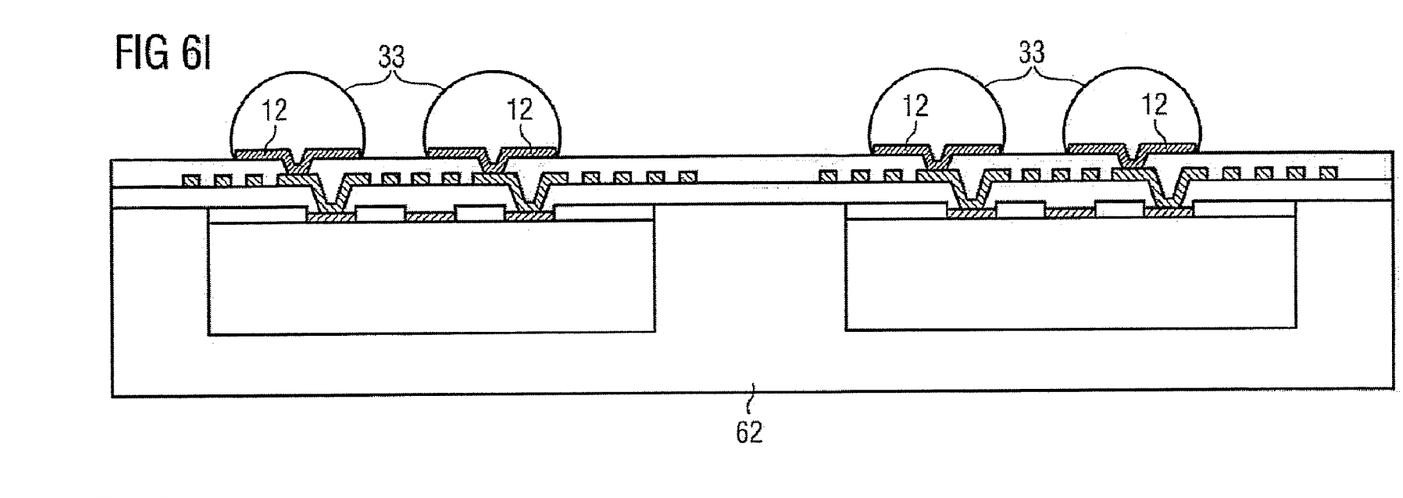
Figure 6J:
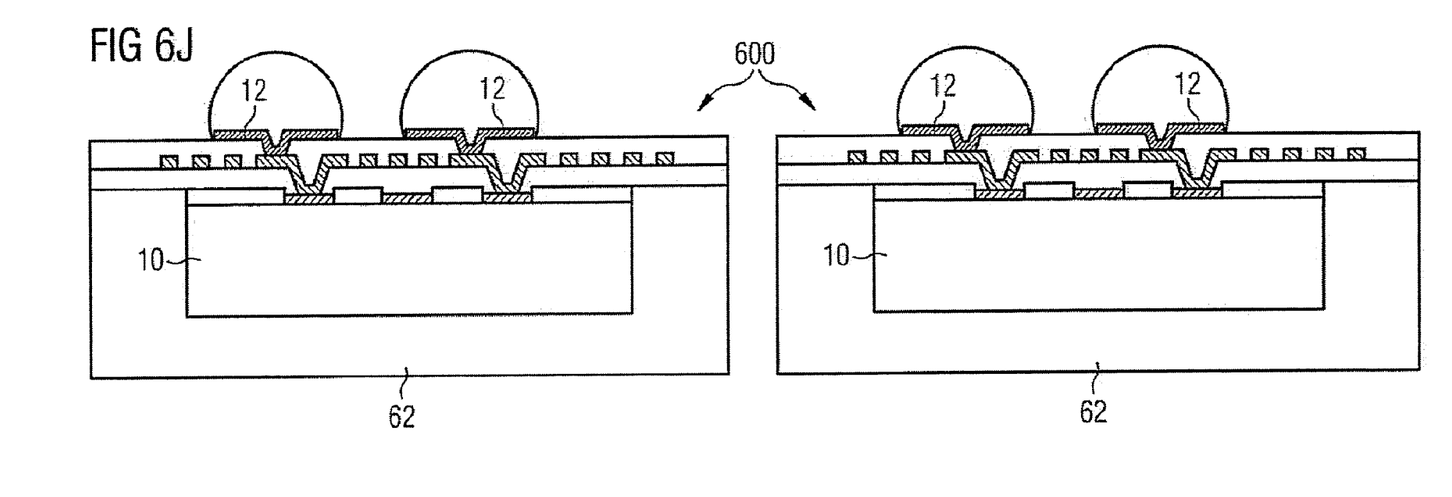

FIGS. 6A to 6J schematically illustrate a method for production of a device 600, a cross section of which is illustrated in FIG. 6J. The device 600 is an implementation of the device 100. Furthermore, the method illustrated in FIGS. 6A to 6M is an implementation of the method illustrated in FIGS. 2A to 2D. The details of the method illustrated in FIGS. 6A to 6J is similar in many ways to the method illustrated in FIGS. 3A to 3M. Therefore, it is referred to method of FIGS. 3A to 3M in the following where appropriate.

In order to manufacture the device 600, a carrier 60 is provided as illustrated in FIG. 6A. The carrier 60 may be a plate made of a rigid material, for example a metal, such as nickel, steel or stainless steel, laminate, film or a material stack. The carrier 60 may have at least one flat surface on which components of the device 600 can be placed. The shape of the carrier 60 is not limited to any geometric shape, for example the carrier 60 may be round or square-shaped. The carrier 60 may have any appropriate size. An adhesive tape 61, for example a double sided sticky tape, may be laminated onto the carrier 60.

As illustrated in FIG. 6B, a plurality of semiconductor chips 10 are placed over the carrier 20 (only two semiconductor chips 10 are illustrated). The semiconductor chips 10 can be fixed on the adhesive tape 61. For attaching the semiconductor chips 10 to the carrier 60, other kinds of attaching materials may in one embodiment be used. The semiconductor chips 10 may be arranged in an array.

The semiconductor chips 10 are relocated on the carrier 60 in larger spacing as they have in the wafer bond. The semiconductor chips 10 may have been manufactured on the same semiconductor wafer, but may in one embodiment have been manufactured on different wafers. Furthermore, the semiconductor chips 10 may be physically identical, but may also contain different integrated circuits and/or represent other components.

The semiconductor chips 10 may have contact pads 23 exposed from a passivation layer 22 and may be arranged over the carrier 60 with their contact pads 23 facing the carrier 60.

After the semiconductor chips 10 have been mounted on the carrier 60, they are encapsulated with an electrically insulating material 62 thereby forming a layer of the electrically insulating material 62 as illustrated in FIG. 6C. For example, the electrically insulating material 62 may be a duroplastic or thermosetting mold material. The gaps between the semiconductor chips 10 are also filled with the mold material 62. The mold material 62 may be based on an epoxy material and may contain a filling material consisting of small particles of glass (SiO2) or other electrically insulating mineral filler materials like Al2O3 or organic filler materials.

As an alternative to the mold material, another polymer material may be used as the electrically insulating material 62 to cover the semiconductor chips 10. The polymer material 62 may have the shape of an electrically insulating foil or sheet, which is laminated on top of the semiconductor chips 10 as well as the carrier 60. Heat and pressure may be applied for a time suitable to attach the polymer foil or sheet 62 to the underlying structure. The gaps between the semiconductor chips 10 are also filled with the polymer material 62. The polymer material 62 may, for example, be a prepreg (short for preimpregnated fibers) that is a combination of a fiber mat, for example glass or carbon fibers, and a resin, for example a duroplastic material. Prepreg materials are usually used to manufacture PCBs. Well known prepreg materials that are used in PCB industry and that can be used here as the polymer material 62 are: FR-2, FR-3, FR-4, FR-5, FR-6, G-10, CEM-1, CEM-2, CEM-3, CEM-4 and CEM-5. Prepreg materials are bi-stage materials, which are flexible when applied over the semiconductor chips 10 and hardened during a heat-treatment. For the lamination of the prepreg the same or similar processes can be used as in PCB manufacturing.

The semiconductor chips 10 covered with the electrically insulating material 62 are released from the carrier 60, and the adhesive tape 61 is pealed from the semiconductor chips 10 as well as from the electrically insulating material 62 as illustrated in FIG. 6D. The adhesive tape 61 may feature thermo-release properties, which allow the removal of the adhesive tape 61 during a heat-treatment. The removal of the adhesive tape 61 from the carrier 60 is carried out at an appropriate temperature, which depends on the thermo-release properties of the adhesive tape 61 and is usually higher than 150° C.

After the release of the carrier 60 and the adhesive tape 61 the active surfaces of the semiconductor chips 10 as well as a surface of the electrically insulating material 62 form a common planar surface. As illustrated in FIGS. 6E to 6I, a redistribution layer may be applied to this surface. The manufacturing of the redistribution layer of the devices 600 is similar to the manufacturing of the redistribution layer of the devices 300 as described above in connection with FIGS. 3B to 3L. However, in contrast to the devices 300, the redistribution layer of the devices 600 may intersect the outline of the semiconductor chips 10 and may extend to the electrically insulating material 62 in which the semiconductor chips 10 are embedded.

Similar to the devices 300, the external contact pads 12 of the devices 600 are formed such that at least some of the external contact pads 12 overlap sections of one or two or more conductor lines 11, which are arranged below the respective external contact pad 12. In other words, these portions of the conductor lines 11 lie within a projection of the external contact pads 12 onto the top surface of the semiconductor chips 10. The projection may be orthogonal to the top surface of the semiconductor chips 10. The direction of the projection is indicated in FIG. 6H by the arrows 32, and the outlines of the areas defined by the projections are marked by the dashed lines 13.

As illustrated in FIG. 6J, the devices 600 are separated from one another by separation of the electrically insulating material 62 and the redistribution layer, for example by sawing, cutting, etching or a laser beam.

The devices 600 manufactured by the method described above may be fan-out type packages. The layer of the electrically insulating material 62 allows the redistribution layer to extend beyond the outline of the semiconductor chips 10. The external contact pads 12 therefore do not need to be arranged within the outline of the semiconductor chips 10, but can be distributed over a larger area. The increased area which is available for arrangement of the external contact pads 12 as a result of the layer of the electrically insulating material 62 means that the external contact pads 12 cannot only be arranged at a great distance from one another, but that the maximum number of external contact pads 12 which can be arranged there is likewise increased compared to the situation when all the external contact pads 12 are arranged within the outline of the semiconductor chips 10.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
    a semiconductor chip;
    a plurality of conductor lines placed over the semiconductor chip; and
    a first external contact pad and a second external contact pad each placed over the plurality of conductor lines,
    wherein portions of the plurality of conductor lines are arranged between the first external contact pad and the second external contact pad and extend in parallel to each other in a direction orthogonal to a shortest connection line between the first and second external contact pads, and at least one of the portions of the plurality of conductor lines, lies within a projection of the first and second external contact pads on the semiconductor chip, and
    wherein the plurality of conductor lines is electrically insulated from the first and second external contact pads.

2. The device of claim 1, wherein the semiconductor chip comprises contact pads located on a first surface of the semiconductor chip and the first surface faces the plurality of conductor lines.

3. The device of claim 2, wherein one of the plurality of conductor lines electrically couples one of the contact pads to a further external contact pad.

4. The device of claim 2, wherein the first surface of the semiconductor chip defines a first plane and the projection of the first and second external contacts pads on the semiconductor chip is an orthogonal projection on the first plane.

5. The device of claim 1, comprising solder deposits placed over the first and second contacts pads.

6. The device of claim 1, wherein the plurality of conductor lines is part of a first metallization layer and the first and second external contact pads are electrically coupled to the first metallization layer.

7. The device of claim 1, wherein the first and second external contact pads are part of a second metallization layer.

8. The device of claim 1, wherein the plurality of conductor lines is covered with an electrically insulating material.

9. The device of claim 1, wherein the first external contact pad has a first surface facing away from the semiconductor chip and the first surface of the first external contact pad is completely exposed.

10. The device of claim 1, wherein the device is a wafer level package.

11. The device of claim 1, wherein the semiconductor chip has a side surface and the side surface is covered with a mold material.

12. A wafer-level-package, comprising:
    a semiconductor chip;
    a first metallization layer placed over the semiconductor chip, the first metallization layer including a plurality of conductor lines; and
    a second metallization layer placed over the first metallization layer, the second metallization layer comprising a first external contact pad and a second external contact pad,
    wherein portions of the plurality of conductor lines are arranged between the first external contact pad and the second external contact pad and extend in parallel to each other in a direction orthogonal to a shortest connection line between the first and second external contact pads, and at least one of the first external contact pad and the second external contact pad overlaps at least a portion of one of the plurality of conductor lines, and
    wherein the plurality of conductor lines is electrically insulated from the first and second external contact pads.

13. The wafer-level-package of claim 12,
    wherein the first external contact pad and the second contact pad each overlap at least a portion of one or more of the plurality of conductor lines located between the first external contact pad and the second external contact pad.

* * * * *